United States Patent
Chen et al.

(10) Patent No.: US 11,245,423 B2
(45) Date of Patent: *Feb. 8, 2022

(54) INTERLEAVING METHOD AND APPARATUS

(71) Applicant: HUAWEI TECHNOLOGIES CO., LTD., Shenzhen (CN)

(72) Inventors: Ying Chen, Hangzhou (CN); Gongzheng Zhang, Hangzhou (CN); Hejia Luo, Hangzhou (CN); Yunfei Qiao, Hangzhou (CN); Rong Li, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/787,045

(22) Filed: Feb. 11, 2020

(65) Prior Publication Data
US 2020/0177206 A1 Jun. 4, 2020

Related U.S. Application Data

(63) Continuation of application No. PCT/CN2018/100067, filed on Aug. 10, 2018.

(30) Foreign Application Priority Data

Aug. 11, 2017 (CN) .......................... 201710687842.2

(51) Int. Cl.
*H03M 13/00* (2006.01)
*H03M 13/27* (2006.01)
*H03M 13/13* (2006.01)

(52) U.S. Cl.
CPC ....... *H03M 13/2707* (2013.01); *H03M 13/13* (2013.01); *H03M 13/618* (2013.01); *H03M 13/6362* (2013.01)

(58) Field of Classification Search
CPC ............. H03M 13/2707; H03M 13/13; H03M 13/618; H03M 13/6362
See application file for complete search history.

(56) References Cited

U.S. PATENT DOCUMENTS

2011/0280186 A1* 11/2011 Rasquinha ........ H03M 13/6558
370/328
2014/0208183 A1 7/2014 Mahdavifar et al.
(Continued)

FOREIGN PATENT DOCUMENTS

CN 102594485 A 7/2012
CN 103023618 A 4/2013
(Continued)

OTHER PUBLICATIONS

Huawei et al: "Rate matching for Polar code",3GPP Draft; R1-1711702, Jun. 28, 2017 (Jun. 28, 2017), XP051305952,total 6 pages.
(Continued)

*Primary Examiner* — Samir W Rizk
(74) *Attorney, Agent, or Firm* — Hauptman Ham, LLP

(57) ABSTRACT

An interleaving method and apparatus are provided, to reduce complexity of implementation processes of polar code interleaving and rate matching. The method includes: obtaining encoded bits after polar code encoding, and sorting the encoded bits based on a priority order of performing a rate matching operation, to obtain a first bit sequence. The first bit sequence includes j subsequences, and j is a positive integer. The method further includes writing the first bit sequence into an interleaver of i rows and j columns. Bits in a column in the interleaver include one of the j subsequences; and reading out bits from the interleaver column by column, until M bits are read. At least two adjacent columns have opposite readout directions, and M is a target code length.

20 Claims, 8 Drawing Sheets

(56) References Cited

U.S. PATENT DOCUMENTS

| | | | |
|---|---|---|---|
| 2016/0352464 | A1 | 12/2016 | Shen et al. |
| 2017/0005753 | A1 | 1/2017 | Shen et al. |
| 2017/0012739 | A1 | 1/2017 | Shen et al. |
| 2017/0264394 | A1 | 9/2017 | Shen et al. |
| 2018/0294920 | A1 | 10/2018 | Chen et al. |
| 2019/0166611 | A1* | 5/2019 | Noh ................ H04L 1/0072 |
| 2019/0296769 | A1 | 9/2019 | Zhang et al. |
| 2019/0372603 | A1 | 12/2019 | Shen et al. |
| 2020/0186284 | A1* | 6/2020 | Noh ................ H04L 1/0067 |
| 2020/0244288 | A1* | 7/2020 | Noh ................ H04L 1/0047 |

FOREIGN PATENT DOCUMENTS

| | | |
|---|---|---|
| CN | 106817195 A | 6/2017 |
| CN | 107425941 A | 12/2017 |
| CN | 107005690 B | 10/2019 |
| WO | 2015074192 A1 | 5/2015 |
| WO | 2015123855 A1 | 8/2015 |
| WO | 2015139248 A1 | 9/2015 |
| WO | 2015139297 A1 | 9/2015 |
| WO | 2017101631 A1 | 6/2017 |

OTHER PUBLICATIONS

Huawei et al:"Interleaver design for Polar coden",3GPP Draft; R1-1709999,Jun. 26, 2017 (Jun. 26, 2017), XP051299224,total 4 pages.

3GPP TSG RAN WG1 NR Ad-Hoc#2,R1-1711128,: Interleaving design of Polar codes NTT Docomo Qingdao, China Jun. 27-30, 2017 total 6 pages.

MediaTek Inc., Polar Code Size and Rate-Matching Design for NR Control Channels. 3GPP TSG RAN WG1 RAN1 #88 Meeting, Athens, Greece, Feb. 13-17, 2017, R1-1702735, 8 pages.

NTT Docomo, Discussion on Polar codes design. 3GPP TSG RAN WG1 NR Ad-Hoc Meeting, Spokane, USA Jan. 16-20, 2017, R1-1700867, 7 pages.

NTT Docomo, Discussion on construction of Polar codes. 3GPP TSG RAN WG1 Meeting #88, Athens, Greece Feb. 13-17, 2017, R1-1702850, 9 pages.

Japanese Office Action issued in corresponding Japanese Application No. 2019-552562, dated Nov. 22, 2021, pp. 1-3.

* cited by examiner

INTERLEAVING METHOD AND APPARATUS

CROSS-REFERENCE TO RELATED APPLICATIONS

This application is a continuation of International Application No. PCT/CN2018/100067, filed on Aug. 10, 2018, which claims priority to Chinese Patent Application No. 201710687842.2, filed on Aug. 11, 2017. The disclosures of the aforementioned applications are hereby incorporated by reference in their entireties.

TECHNICAL FIELD

Various embodiments relate to the field of communications technologies, and in particular, to an interleaving method and apparatus.

BACKGROUND

Rapid evolution of wireless communications indicates that a future 5th generation (5G) communications system will have some new features. Three most typical communication scenarios include an enhanced mobile broadband (eMBB) scenario, a massive machine type communications (mMTC) scenario, and an ultra-reliable and low latency communications (URLLC) scenario. Requirements of these communication scenarios pose new challenges to an existing long term evolution (LTE) technology. As a most basic radio access technology, channel coding is one of important research objects that meet 5G communications requirements. Currently, a 5G standard is being vigorously developed, and a polar code is also selected as a control channel coding scheme. The polar code is the first and only known channel coding method that can be strictly proved to "achieve" a channel capacity. In different code lengths, especially for a finite code, performance of the polar code is much better than that of a turbo code and a low-density parity-check (LDPC) code. In addition, the polar code has relatively low computational complexity in terms of encoding and decoding. Such advantages enable the polar code to have great development and application prospects in 5G.

To further improve anti-interference performance, an interleaving module is added for some channel coding. On many compound channels on which both a random error and a burst error occur, for example, channels on which shortwave scatter, tropospheric scatter, and the like occur, when an error occurs, a string of data behind is usually affected. Consequently, the burst error is beyond an error-correcting capability of an error-correcting code, decreasing the error-correcting capability. If the burst error is first dispersed into a random error, and then the random error is corrected, the anti-interference performance of a system can be further improved. In an actual application, a digital interleaving unit is connected after an error-correcting encoder at a transmit end, and de-interleaving is performed after demodulation at a receive end. Under action of an interleaving/de-interleaving circuit, a burst error channel is reconstructed into an independent random error channel, and the burst error is expanded to implement error dispersion, so that the burst error is distributed within an error-correcting range of the error-correcting encoder, thereby improving an error-correcting capability of the channel.

Currently, an interleaving design of the polar code cannot be well combined with rate matching. To facilitate the rate matching, an interleaving operation is performed in a rate matching module. To implement randomization of encoded bits, an interleaving module is added for an interleaving operation after the rate matching module, increasing complexity of an implementation process.

SUMMARY

Various embodiments provide an interleaving method and apparatus, to reduce complexity of implementation processes of polar code interleaving and rate matching.

According to a first aspect, an interleaving method is provided. A to-be-interleaved bit sequence is written into an interleaver, and M bits are read based on a target code length M obtained through rate matching. Some subsequences are read in a reversal order in a reading process, to achieve interleaving through reading in the reversal order. In this way, compared with the prior art, a simple interleaver design omits a quadratic interleaving operation, greatly reducing implementation complexity. The rate matching is combined with the interleaving, and the rate matching is facilitated. In addition, randomization of encoded bits can also be facilitated.

In one embodiment, encoded bits after polar code encoding are obtained, and the encoded bits are sorted based on a priority order of performing a rate matching operation, to obtain a first bit sequence, where the first bit sequence includes N bits, the first bit sequence includes j subsequences, and i and j are both positive integers. The first bit sequence is written into an interleaver of i rows and j columns, where bits in a column in the interleaver include one of the j subsequences. Bits are read out from the interleaver column by column, until M bits are read, where at least two adjacent columns have opposite readout directions, and M is a target code length of a polar code. In this way, reading and interleaving can be simultaneously performed, and the rate matching can be implemented by using a reading length.

In one embodiment, if a manner of the rate matching is puncturing, the bits are read out column by column by starting from the last bit of a $j^{th}$ column of the interleaver, until the M bits are read; or P bit locations starting from the first bit of the first column of the interleaver are skipped, and bits other than bits at the P bit locations are read out column by column by starting from a $(P+1)^{th}$ bit, until the M bits are read.

In one embodiment, if a manner of the rate matching is shortening, the bits are read out column by column by starting from the first bit of the first column of the interleaver, until the M bits are read; or P bit locations starting from the last bit of a $j^{th}$ column of the interleaver are skipped, and bits other than bits at the P bit locations are read out column by column by starting from a $(P+1)^{th}$ bit until the M bits are read.

In one embodiment, the reading out the bits column by column, until the M bits are read may be, but is not limited to being, in the following interleaved reading manners: a manner in which n columns are read in a positive order and n columns are read in a reversal order, and a manner in which n columns are read in a positive order and m columns are read in a reversal order, where n and m are both positive integers, and m is not equal to n. For example, the interleaved reading manner may be a manner in which one column is read in a positive order and one column is read in a reversal order, a manner in which two columns are read in a positive order and two columns are read in a reversal order, a manner in which one column is read in a positive order and two columns are read in a reversal order, or a manner in which two columns are read in a positive order and three columns are read in a reversal order.

In one embodiment, the bits are read out column by column in a reading manner of alternating a positive order and a reversal order, until the M bits are read, where the reading manner of alternating the positive order and the reversal order includes: a reading manner of the positive order first and then the reversal order, or a reading manner of the reversal order first and then the positive order.

In one embodiment, when the encoded bits are sorted based on the priority order of performing the rate matching operation, the encoded bits may be divided into four segments, and bits in the second segment and bits in the third segment may be crossed bit by bit for interleaving.

In one embodiment, when the encoded bits are sorted based on the priority order of performing the rate matching operation, the encoded bits may be divided into S groups, and inter-group interleaving and sorting may be performed on the S groups based on a reliability order of S polarized channels of the polar code.

According to a second aspect, an interleaving method is provided. Bits in some subsequences in a to-be-interleaved bit sequence are sorted in a reversal order and then sequentially read. In this way, interleaving and rate matching can be effectively combined, bit randomization can be implemented by using a simple interleaving design, and a rate matching operation can be facilitated.

In one embodiment, encoded bits after polar code encoding are obtained, and the encoded bits are sorted based on a priority order of performing the rate matching operation, to obtain a first bit sequence, where the first bit sequence includes N bits, the first bit sequence includes j subsequences, and j is a positive integer. Bits in some of the j subsequences are sorted in the reversal order, to obtain a second bit sequence. M bits are read out from the second bit sequence, and the M bits are output, where M is a target code length of a polar code, and M is a positive integer. In this way, implementation complexity of the interleaving and the rate matching can be reduced, the rate matching can be facilitated, and randomization of the encoded bits can also be facilitated.

In one embodiment, bits in at least one of the j subsequences may be sorted in the reversal order. A manner of selecting the subsequence to be sorted in the reversal order may be, but is not limited to, the following manners: selecting a subsequence at intervals of n numbers for sorting in the reversal order, where n is a positive integer; or arbitrarily selecting bits in at least one subsequence for sorting in the reversal order.

In one embodiment, if numbers of the j subsequences are 1 to j, bits in some subsequences that are odd-numbered in the j subsequences are sorted in the reversal order, or bits in some subsequences that are even-numbered in the j subsequences are sorted in the reversal order, to obtain the second bit sequence.

In one embodiment, the second bit sequence is written into an interleaver of i rows and j columns, where bits in a column in the interleaver include one of the j subsequences. The M bits are read from the interleaver.

In one embodiment, i is a positive odd number or a positive prime number.

In one embodiment, if i is known, j=ceiling (N/i), where N is a length of the encoded bits, and ceiling represents a ceiling operation. If j is known, i=ceiling (N/j), where N is the length of the encoded bits, and ceiling represents the ceiling operation.

In one embodiment, if a manner of the rate matching is puncturing, the M bits are sequentially read by starting from the last bit of a $j^{th}$ column of the interleaver; or P bit locations starting from the first bit of the first column of the interleaver are skipped, and the M bits are sequentially read by starting from a $(P+1)^{th}$ bit.

In one embodiment, if a manner of the rate matching is shortening, the M bits are sequentially read by starting from the first bit of the first column of the interleaver; or P bit locations starting from the last bit of a $j^{th}$ column of the interleaver are skipped, and the M bits are sequentially read by starting from a $(P+1)^{th}$ bit.

In one embodiment, the second bit sequence is input into a buffer bit by bit; and the M bits are read from the buffer.

In one embodiment, if a manner of the rate matching is puncturing, the M bits are sequentially read by starting from the last bit in the buffer; or P bit locations starting from the first bit in the buffer are skipped, and the M bits are sequentially read by starting from a $(P+1)^{th}$ bit.

In one embodiment, if a manner of the rate matching is shortening, the M bits are sequentially read by starting from the first bit in the buffer; or P bit locations starting from the last bit in the buffer are skipped, and the M bits are sequentially read by starting from a $(P+1)^{th}$ bit.

In one embodiment, when the encoded bits are sorted based on the priority order of performing the rate matching operation, the encoded bits may be divided into four segments, and bits in the second segment and bits in the third segment may be crossed bit by bit for interleaving.

In one embodiment, when the encoded bits are sorted based on the priority order of performing the rate matching operation, the encoded bits may be divided into S groups, and inter-group interleaving and sorting may be performed on the S groups based on a reliability order of S polarized channels of the polar code.

According to a third aspect, an interleaving apparatus is provided. The apparatus has a function of implementing the method according to any one of the first aspect or the possible designs of the first aspect. The function may be implemented by hardware, or may be implemented by hardware executing corresponding software. The hardware or software includes one or more modules corresponding to the foregoing function.

In one embodiment, when a part or all of the function is implemented by hardware, the interleaving apparatus includes: an input interface circuit, configured to obtain encoded bits after polar code encoding; a logic circuit, configured to perform the behavior according to any one of the first aspect or the possible designs of the first aspect; and an output interface circuit, configured to output M bits.

In some embodiments, the interleaving apparatus may be a chip or an integrated circuit.

In one embodiment, when a part or all of the function is implemented by software, the interleaving apparatus includes: a memory, configured to store a program; and a processor, configured to execute the program stored in the memory. When the program is executed, the polar code encoding apparatus may implement the method according to any one of the first aspect or the possible designs of the first aspect.

In some embodiments, the memory may be a physically independent unit, or may be integrated with the processor.

In one embodiment, when a part or all of the function is implemented by software, the interleaving apparatus includes a processor. A memory configured to store a program is located outside the encoding apparatus, and the processor is connected to the memory through a circuit/wire and is configured to read and execute the program stored in the memory.

According to a fourth aspect, an interleaving apparatus is provided. The apparatus has a function of implementing the method according to any one of the second aspect or the possible designs of the second aspect. The function may be implemented by hardware, or may be implemented by hardware executing corresponding software. The hardware or software includes one or more modules corresponding to the foregoing function.

In one embodiment, when a part or all of the function is implemented by hardware, the interleaving apparatus includes: an input interface circuit, configured to obtain encoded bits after polar code encoding; a logic circuit, configured to perform the behavior according to any one of the second aspect or the possible designs of the second aspect; and an output interface circuit, configured to output M bits.

In some embodiments, the interleaving apparatus may be a chip or an integrated circuit.

In one embodiment, when a part or all of the function is implemented by software, the interleaving apparatus includes: a memory, configured to store a program; and a processor, configured to execute the program stored in the memory. When the program is executed, the polar code encoding apparatus may implement the method according to any one of the second aspect or the possible designs of the second aspect.

In some embodiments, the memory may be a physically independent unit, or may be integrated with the processor.

In one embodiment, when a part or all of the function is implemented by software, the interleaving apparatus includes a processor. A memory configured to store a program is located outside the encoding apparatus, and the processor is connected to the memory through a circuit/wire and is configured to read and execute the program stored in the memory.

According to a fifth aspect, a communications system is provided. The communications system includes a transmit end and a receive end. The transmit end may perform the method according to the first aspect and the possible designs of the first aspect, or perform the method according to the second aspect and the possible designs of the second aspect.

According to a sixth aspect, a computer storage medium is provided. The computer storage medium stores a computer program, and the computer program includes an instruction used to perform the method according to any one of the first aspect or the possible designs of the first aspect or an instruction used to perform the method according to any one of the second aspect or the possible designs of the second aspect.

According to a seventh aspect, an embodiment of this application provides a computer program product including an instruction. When the computer program product is run on a computer, the computer is enabled to perform the method according to each of the foregoing aspects.

DESCRIPTION OF EMBODIMENTS

Figure 1:
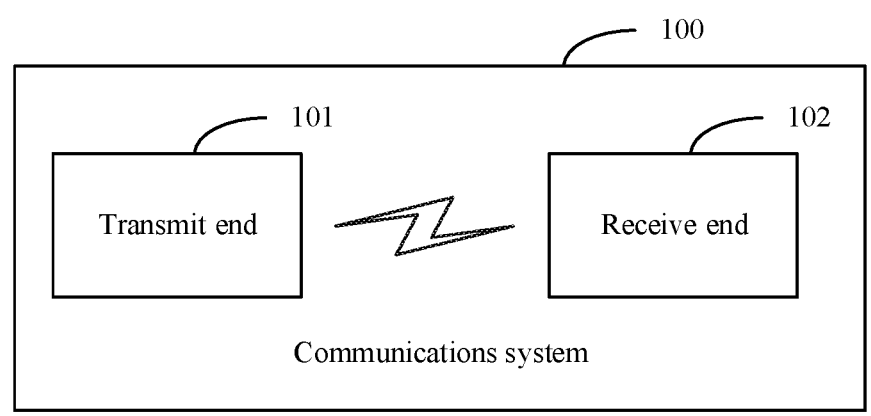
FIG. 1 is a schematic architectural diagram of a communications system to which an embodiment of this application is applied.

The following describes in detail various embodiments with reference to accompanying drawings.

Various embodiments provide an interleaving method and apparatus. A to-be-interleaved bit sequence is written into an interleaver, and M bits are read based on a target code length M obtained through rate matching. Some subsequences are read in a reversal order in a reading process, to achieve interleaving through reading in the reversal order. In this way, compared with the prior art, a simple interleaver design omits a quadratic interleaving operation, greatly reducing implementation complexity. The rate matching is combined with the interleaving, and the rate matching is facilitated. In addition, randomization of encoded bits can also be facilitated.

For ease of understanding of various embodiments herein, a polar code is briefly described below.

An encoding policy of the polar code is transmitting useful information of a user through a noiseless channel and transmitting agreed information or skipping transmitting information through a pure noisy channel. The polar code is also a linear block code. An encoding matrix of the polar code is $G_N$, and an encoding process is $x_1^N = u_1^N G_N$. $u_1^N = (u_1, u_2, \ldots, u_N)$ is a binary row vector and has a length of N (that is, a code length). $G_N$ is an N×N matrix and $G_N = F_2^{\otimes(\log_2(N))}$. $F_2^{\otimes(\log_2(N))}$ is defined as a Kronecker (Kronecker) product of $\log_2 N$ matrices $F_2$. The matrix $$F_2 = \begin{bmatrix} 1 & 0 \\ 1 & 1 \end{bmatrix}.$$

In the encoding process of the polar code, some bits in $u_1^N$ are used to carry information, and are referred to as an information bit set. A set of indexes of these bits is denoted as A; remaining bits are set to fixed values that are pre-agreed upon by a receive end and a transmit end, and are referred to as a fixed bit set or a frozen bit set (frozen bits). A set of indexes of the remaining bits is represented by a complementary set $A^c$ of A. The encoding process of the polar code is equivalent to: $x_1^N = u_A G_N(A) \otimes u_{A^c} G_N(A^C)$. Herein, $G_N(A)$ is a sub-matrix obtained by rows corresponding to the indexes in the set A in $G_N$, and $G_N(A^C)$ is a sub-matrix obtained by rows corresponding to the indexes in the set $A^c$ in $G_N$. $u_A$ is the information bit set in $u_1^N$ and a quantity of $u_A$ is K. $u_A \cup u_{A^c}$ the fixed bit set in $u_1^N$, a quantity of $u_A \cup u_{A^c}$ is N-K, and $u_{A^c}$ are known bits. These fixed bits are usually set to 0. However, the fixed bits may be arbitrarily set, provided that the fixed bits are pre-agreed upon by the receive end and the transmit end. In this way, an encoded output of the polar code may be simplified as: $x_1^N = u_A G_N(A)$. Herein, $u_A$ is the information bit set in $u_1^N$, and $u_A$ is a row vector having a length of K. In other words, $|A|=K$. $|\cdot|$ represents a quantity of elements in a set, K is a size of an information block, $G_N(A)$ is the sub-matrix obtained by the rows corresponding to the indexes in the set A in the matrix $G_N$ and $G_N(A)$ is a K×N matrix.

A construction process of the polar code is a selection process of the set A, and determines performance of the polar code. The construction process of the polar code is usually: determining, based on a code length N of a mother code, that there are N polarized channels in total that respectively correspond to N rows of the encoding matrix, calculating reliability of the polarized channels, using indexes of first K polarized channels having higher reliability as elements in the set A, and using indexes corresponding to remaining N-K polarized channels as elements in the set $A^c$ of the indexes of the fixed bits. The set A determines locations of the information bits, and the set $A^c$ determines locations of the fixed bits.

As shown in FIG. 1, a communications system 100 to which an embodiment in accordance with the disclosure is applied includes a transmit end 101 and a receive end 102. The transmit end 101 may also be referred to as an encoding end, and the receive end 102 may also be referred to as a decoding end. The transmit end 101 may be a base station, and the receive end 102 may be a terminal. Alternatively, the transmit end 101 is a terminal, and the receive end 102 is a base station. The base station is an apparatus deployed in a radio access network for providing a wireless communication function for the terminal. The base station may include a macro base station, a micro base station, a relay station, an access point, and the like in various forms, and may be applied to systems in different radio access technologies, for example, a long term evolution (LTE) system or more possible communications systems such as a 5th generation (5G) communications system. The base station may alternatively be another network device having a base station function, and particularly, may be a terminal serving as a base station in D2D communication. The terminal may include a handheld device, an in-vehicle device, a wearable device, or a computing device that has a wireless communication function, another processing device connected to a wireless modem, user equipment (UE) in various forms, a mobile station (MS), and the like.

Figure 2:
FIG. 2 is a schematic diagram of a procedure performed by an encoding end according to an embodiment of this application.

As shown in FIG. 2, a procedure performed by an encoding end in accordance with the disclosure is approximately: Polar code encoding is performed on to-be-encoded information. An example encoding process is described above. Encoded bits obtained after the polar code encoding are processed, and bits after a processing process are bits after interleaving and rate matching. In the processing process, the encoded bits are first sorted based on a priority order of performing a rate matching operation, to obtain a bit sequence, where the bit sequence herein is referred to as a first bit sequence, and M bits are selected from the first bit sequence based on a target code length M, where M is a positive integer. In a selection process or before the selection, some subsequences in the M bits are sorted in a reversal order. In this way, the rate matching and the interleaving can be implemented in a same module, thereby omitting a step of interleaving a bit sequence after rate matching in the prior art, and reducing implementation complexity.

The rate matching operation may include, but not limited to, puncturing and shortening. A priority of performing the rate matching operation is a descending order of possibility that the encoded bits are punctured, or a descending order of possibility that the encoded bits are shortened. Certainly, the priority of performing the rate matching operation is not limited thereto, and locations of the encoded bits may be sorted based on a requirement in an actual application.

Various embodiments provide two examples of sorting the encoded bits based on the priority of performing the rate matching operation below.

Figure 3:
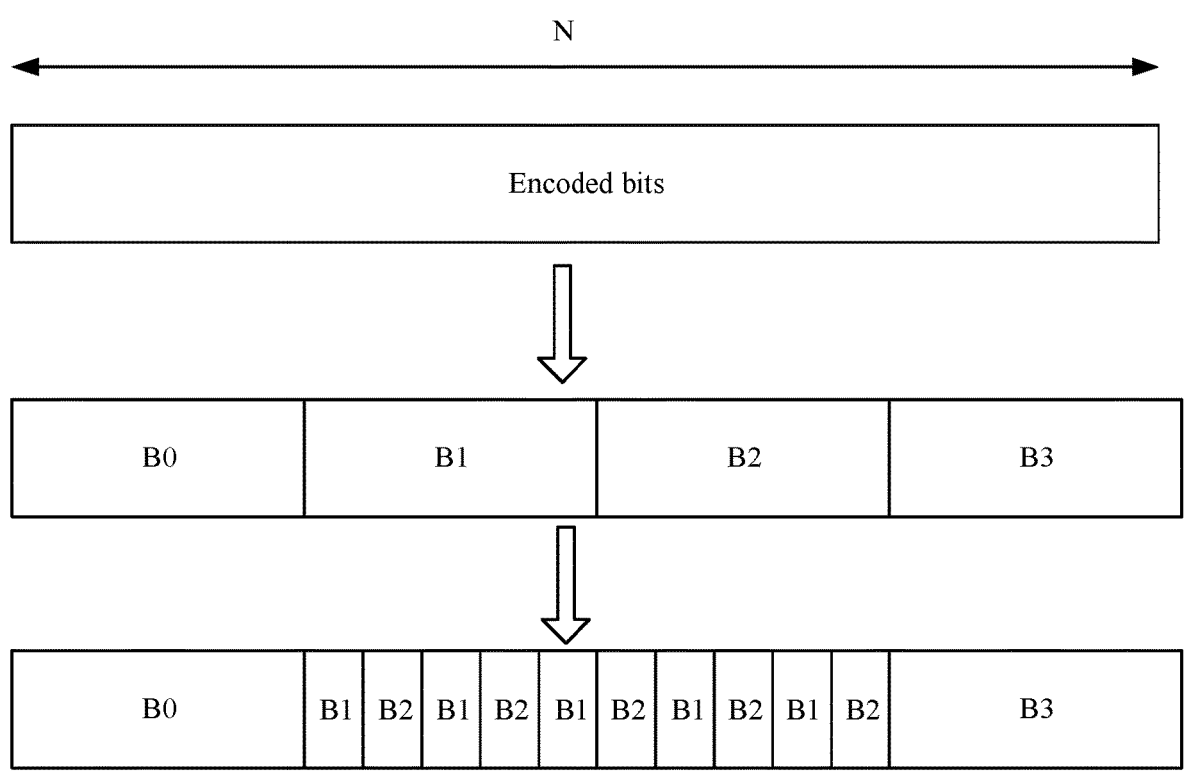
FIG. 3 is a schematic diagram 1 of a manner of resorting encoded bits according to an embodiment of this application.

Sorting method 1: As shown in FIG. 3, encoded bits having a length of N are equally divided into four segments in sequence, and the four segments are denoted as B0, B1, B2, and B3. In an application, if the rate matching is performed through puncturing, when a quantity P of puncturing ≤N/4, puncturing is sequentially performed by starting from the first bit of B0; and when P>N/4, puncturing is performed by alternately selecting bits from B1 and B2 instead of being sequentially performed. If the rate matching is performed through shortening, when a quantity P of puncturing ≤N/4, puncturing is sequentially performed from back to front by starting from the last bit of B3 (where the puncturing herein is shortening); and when P>N/4, puncturing is performed by alternately selecting bits from B1 and B2 instead of being sequentially performed. To facilitate sequential rate matching, bit locations may be first sorted based on the foregoing priority order before the rate matching, to be specific, bits in B1 and B2 in the encoded bits are crossed bit by bit for interleaving. In this way, the puncturing may be directly performed bit by bit from front to back, and the shortening may be directly performed bit by bit from back to front, to facilitate the rate matching.

Figure 4:
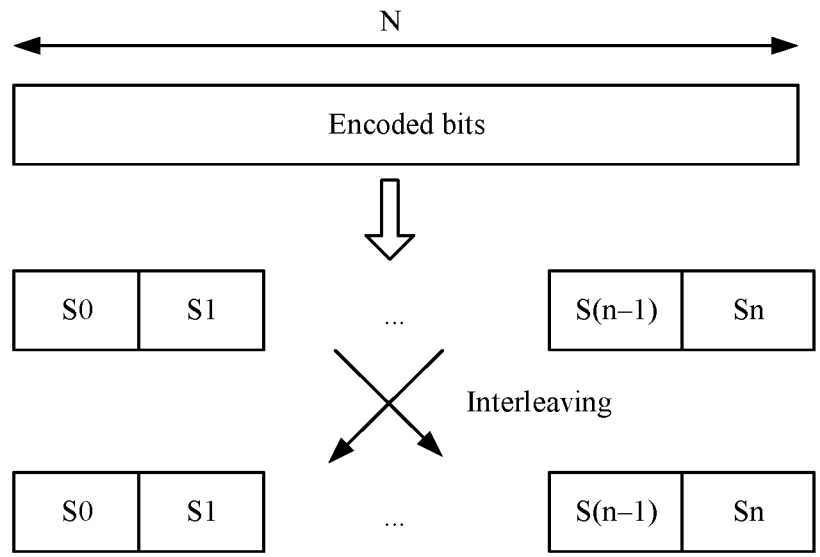
FIG. 4 is a schematic diagram 2 of a manner of resorting encoded bits according to an embodiment of this application.

Sorting method 2: As shown in FIG. 4, encoded bits having a length of N are equally divided into S groups, and for example, numbers of the S groups may be 0 to S−1. Locations of the S groups may be sorted. For example, if S is an integral power of 2, the S groups may be sorted based on a reliability sorting sequence of a polar code having a code length of S. The sorting sequence of the polar code includes numbers of polarized channels or reliability values of the polarized channels. In a case, if S is not an integral power of 2, a reliability sorting sequence of first S polarized channels is selected based on a reliability sorting sequence of a polar code having a code length greater than S, and the S groups are sorted based on the reliability sorting sequence of the first S polarized channels. After the S groups are sorted, a sequence having a length of N is obtained through resorting. If the rate matching is performed through puncturing, puncturing is sequentially performed by starting from the first bit of the sequence having a length of N that is obtained through resorting. If the rate matching is performed through shortening, shortening is sequentially performed from back to front by starting from the last bit of the sequence having a length of N that is obtained through resorting.

For example, N=32, 16 groups are obtained through division by using two bits as a group, and a reliability sorting sequence with a code length of 16 is [0, 1, 2, 4, 8, 3, 5, 6, 9, 10, 12, 7, 11, 13, 14, 15]. If puncturing is performed from front to back based on reliability of the groups, for example, when a quantity of puncturing is 8, blocks 0, 1, 2, and 4 are punctured; or when a quantity of puncturing is 9, blocks 0, 1, 2, and 4 and the first bit of a block 8 are punctured. If shortening is performed from back to front based on reliability of blocks, for example, when a quantity of shortening is 8, blocks 15, 14, and 13 are shortened; or when a quantity of puncturing is 9, blocks 15, 14, and 13 and the last bit of a block 11 are shortened.

An interleaver is used in the solutions designed in the various embodiments. For ease of understanding of subsequent content, the interleaver is briefly described below.

Figure 5:
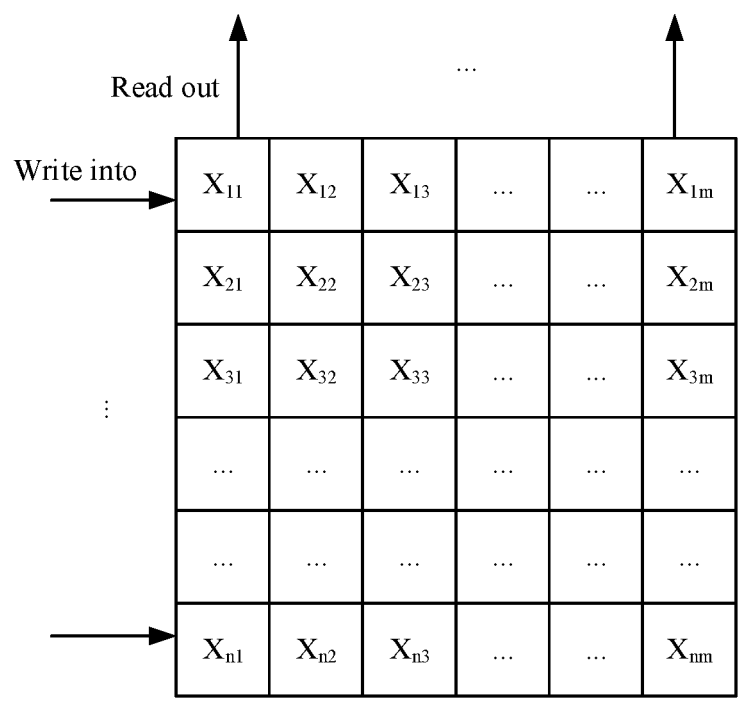
FIG. 5 is a schematic diagram of writing by row into and reading out by column from a row-column interleaver according to an embodiment of this application.

Bits to be interleaved by using the interleaver are referred to as to-be-interleaved bits. After the to-be-interleaved bits are written into the interleaver, the bits are read out from the interleaver. A sequence of the bits that are read out changes compared with that of the written bits, to achieve interleaving. A method for writing into and reading from the interleaver may be writing by row and reading by column, writing by column and reading by row, writing by column and reading by column, writing by row and reading by column in a zigzag shape, writing by column and reading by column in a zigzag shape, or the like. The several manners of writing and reading are in the prior art, and details are not described herein. During writing, a quantity of rows may be first fixed, and a quantity of columns, to be specific, a quantity of bits included in each row, is calculated. Alternatively, a quantity of columns may be first fixed, and a quantity of rows, to be specific, a quantity of bits included in each column, is calculated. If the quantity of rows is fixed to i, the quantity of columns is a value obtained after a total length of bits on which row-column interleaving is performed is divided by i and then rounded up. If the quantity of columns is fixed to j, the quantity of rows is a value obtained after a total length of bits on which row-column interleaving is performed is divided by j and then rounded up. During writing by row, the to-be-interleaved bits are written into the interleaver row by row, and a quantity of bits input in each row is the quantity of columns that is calculated by using the foregoing method. If a quantity of bits input in the last row is insufficient, the last row is supplemented by using a null bit. During writing by column, the to-be-interleaved bits are written into the interleaver column by column, and a quantity of bits input in each column is the quantity of rows that is calculated by using the foregoing method. If a quantity of bits input in the last column is insufficient, the last column is supplemented by using a null bit. If the null bit is filled, the null bit needs to be deleted after interleaving. Using the writing by row and reading by column as an example, as shown in FIG. 5, an m*n dimensional matrix is generated based on the to-be-interleaved bits, an operation of writing by row and reading by column is performed on the to-be-interleaved bits based on rows and columns of the matrix, a data input sequence is $[X_{11}, X_{12}, X_{13}, \ldots, X_{1m}, X_{21}, X_{22}, X_{23}, \ldots, X_{2m}, X_{n1}, X_{n2}, \ldots, X_{nn}]$, and a data output sequence is $[X_{11}, X_{21}, X_{31}, \ldots, X_{n1}, X_{12}, X_{22}, X_{32}, \ldots, X_{n2}, \ldots, X_{1m}, X_{2m}, X_{3m}, X_{nm}]$, where $X_{11}$ is a bit of the first row and first column in the interleaver. In an actual application, a size of the interleaver may be determined based on a size of an interleaving matrix formed by using a quantity of rows and a quantity of columns, and interleavers of different quantities of rows and different quantities of columns have different sizes. The size of the interleaver may alternatively be determined based on a size of a memory block that is allocated by a system and that is used for an interleaver application. In this case, the size of the memory block needs to be greater than the size of the matrix formed by using the quantity of rows and the quantity of columns. Interleaving of difference quantities of rows and difference quantities columns occupies resources of different sizes in the memory block. The row or column of the interleaver that is described herein is a row or column in the interleaving matrix formed by using the quantity of rows and the quantity of columns when specific values of the quantity of rows and the quantity of columns are determined. For example, an $j^{th}$ row of the interleaver is an $j^{th}$ row in a determined interleaving matrix of i rows and j columns; and a $j^{th}$ column of the interleaver is a $j^{th}$ column of the determined interleaving matrix of i rows and j columns. When encoded bits are written into a row-column interleaver, and when a quantity N of the encoded bits is less than i*j, zero may be filled.

In accordance with the disclosure, implementations of two interleaving methods are designed in various embodiments, and the two interleaving methods can both achieve the foregoing effect. Based on the architecture of the communications system shown in FIG. 1, an execution body for implementing the interleaving method may be the transmit end 101. The two interleaving methods are described in detail below.

Figure 6:
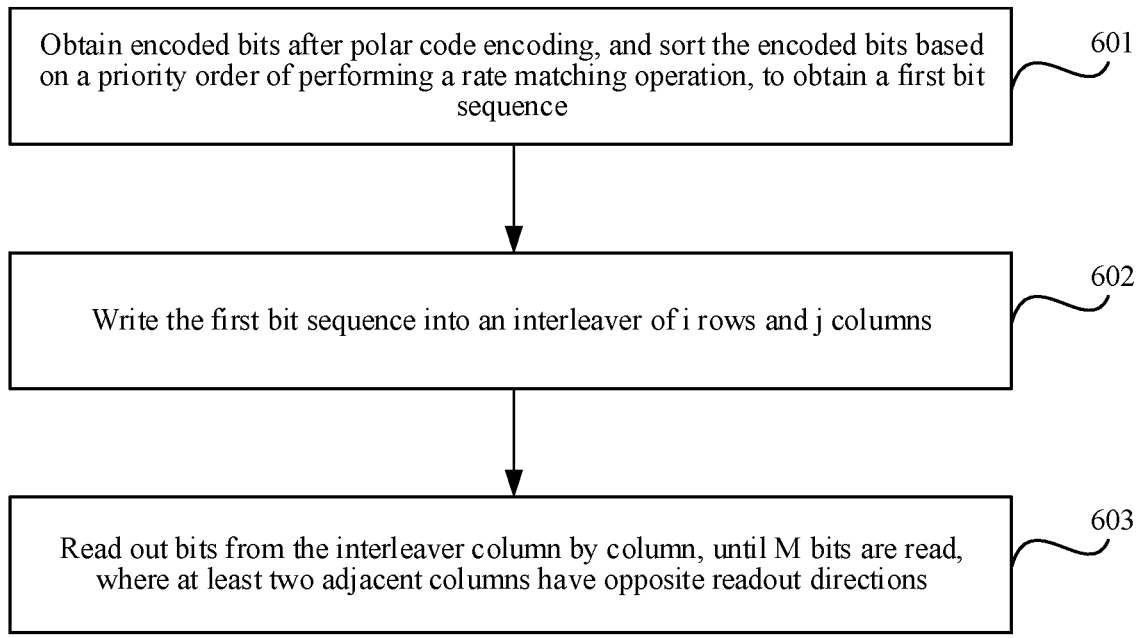
FIG. 6 is a schematic diagram 1 of an interleaving method according to an embodiment of this application.

Interleaving Method 1:

As shown in FIG. 6, an example procedure of the interleaving method provided in this embodiment is described below.

Step 601. Obtain encoded bits after polar code encoding, and sort the encoded bits based on a priority order of performing a rate matching operation, to obtain a first bit sequence.

The first bit sequence includes N bits, the first bit sequence includes j subsequences, and j is a positive integer. A method for obtaining the first bit sequence may be, but is not limited to, the foregoing sorting method 1 or sorting method 2.

Step 602. Write the first bit sequence into an interleaver of i rows and j columns.

Bits in a column in the interleaver include one of the j subsequences. When the first bit sequence is written into the interleaver of i rows and j columns, if N<(i*j), a null bit may be used to supplement, to be specific, zero is filled.

For example, the first bit sequence is written into the interleaver by column bit by bit based on a manner of i rows and j columns, and the first bit sequence occupies a size of an interleaving matrix formed by i rows and j columns in the interleaver.

Step 603. Read out bits from the interleaver column by column, until M bits are read, where at least two adjacent columns have opposite readout directions, and M is a target code length.

For example, the interleaving method 1 is writing the first bit sequence into the interleaver and performing writing and reading in a manner of writing by column and reading by column. During the writing, the first bit sequence is sequentially written into the interleaver column by column; and during the reading, it is ensured that at least two adjacent columns of subsequences have opposite readout directions, to achieve interleaving. In addition, the M bits may be read based on the target code length M, to achieve the rate matching.

In the following descriptions, the last bit of a $j^{th}$ column of the interleaver may be understood as the last bit of a $j^{th}$ written column of the first bit sequence; and the first bit of the first column of the interleaver may be understood as the first bit of the first written column of the first bit sequence. Such an understanding manner applies to descriptions of this specification.

During the reading, a starting location at which the bits are read may be first determined based on a manner of the rate matching.

If the manner of the rate matching is puncturing, the bits are read column by column by starting from the last bit of the $j^{th}$ column of the interleaver, until the M bits are read. In the rate matching manner of puncturing, the M bits may be directly read from the first bit sequence. Certainly, P puncturing locations may alternatively be skipped, and then the M bits are read from remaining bits. In other words, P bit locations starting from the first bit of the first column of the interleaver may alternatively be skipped, and bits other than bits at the P bit locations are read out column by column by starting from a $(P+1)^{th}$ bit, until the M bits are read.

If the manner of the rate matching is shortening, the subsequences are read column by column by starting from the first bit of the first column of the interleaver, until the M bits are read. Similarly, in the rate matching manner of shortening, the M bits may be directly read from the first bit sequence. Alternatively, P puncturing locations may be skipped, and then the M bits are read from remaining bits. In other words, P bit locations starting from the last bit of the $j^{th}$ column of the interleaver may alternatively be skipped, and bits other than bits at the P bit locations are read out column by column by starting from a $(P+1)^{th}$ bit, until the M bits are read.

As described above, in a process of reading column by column, it should be ensured that at least two adjacent columns have opposite readout directions, to achieve the interleaving. In the interleaving method, an interleaved reading manner may be, but not limited to, the following manners: a manner in which n columns are read in a positive order and n columns are read in a reversal order, and a manner in which n columns are read in a positive order and m columns are read in a reversal order, where n and m are both positive integers, and m is not equal to n. For example, the interleaved reading manner may be a manner in which one column is read in a positive order and one column is read in a reversal order, a manner in which two columns are read in a positive order and two columns are read in a reversal order, a manner in which one column is read in a positive order and two columns are read in a reversal order, or a manner in which two columns are read in a positive order and three columns are read in a reversal order.

Using the reading manner in which one column is read in a positive order and one column is read in a reversal order as an example, when the M bits are read, the subsequences are read column by column in a reading manner of alternating the positive order and the reversal order by starting from a starting location determined based on the rate matching manner, until the M bits are read. The reading manner of alternating the positive order and the reversal order includes: a reading manner of the positive order first and then the reversal order, or a reading manner of the reversal order first and then the positive order. The positive order herein may be understood as being the same as a writing direction, or may be understood as being opposite to the writing direction.

Figure 7:
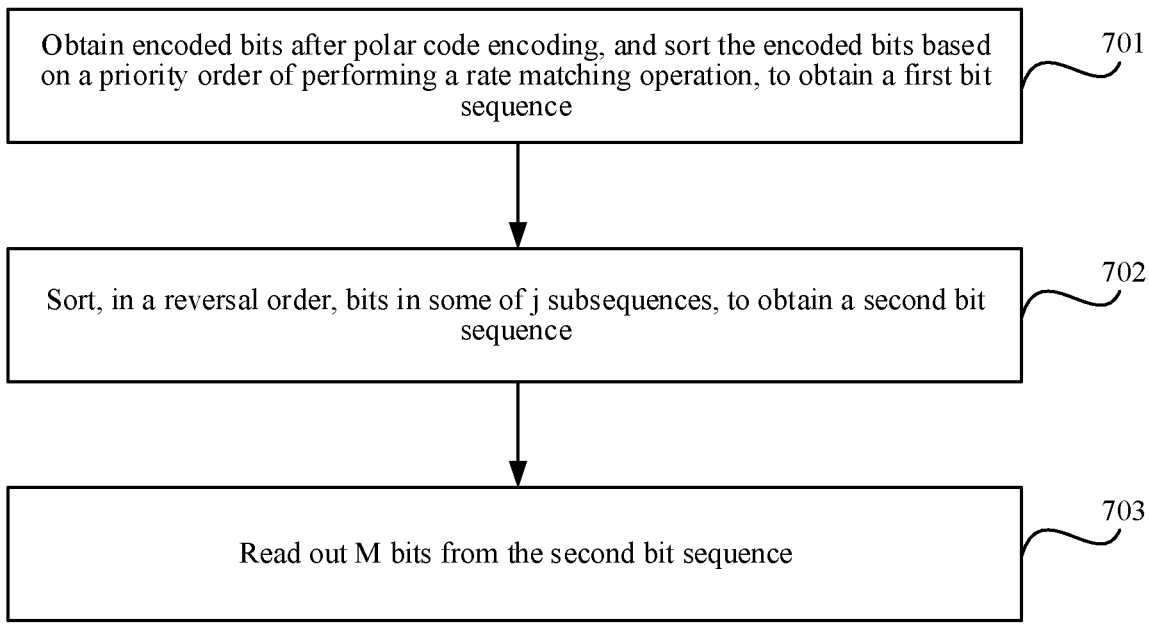
FIG. 7 is a schematic diagram 2 of an interleaving method according to an embodiment of this application.

Interleaving Method 2:

As shown in FIG. 7, a specific procedure of the interleaving method provided in this embodiment of this application is described below.

Step 701. Obtain encoded bits after polar code encoding, and sort the encoded bits based on a priority order of performing a rate matching operation, to obtain a first bit sequence.

The first bit sequence includes N bits, the first bit sequence includes j subsequences, and j is a positive integer. A method for obtaining the first bit sequence may be, but is not limited to, the foregoing sorting method 1 or sorting method 2.

Step 702. Sort bits in some of the j subsequences in a reversal order, to obtain a second bit sequence.

Step 703. Select M bits from the second bit sequence and output the M bits.

M is a target code length of a polar code, and M is a positive integer.

In the interleaving method 1, reading orders of difference columns are opposite, to achieve the interleaving. In the interleaving method 2, the bits in the some subsequences in the first bit sequence are sorted in the reversal order and then sequentially read. In both of the two methods, the interleaving and the rate matching can be effectively combined, bit randomization can be implemented by using a simple interleaving design, and the rate matching operation can be facilitated.

For example, in the interleaving method 2, bits in at least one of the j subsequences may be sorted in the reversal order. A manner of selecting the subsequence to be sorted in the reversal order may be, but is not limited to, the following manners: selecting a subsequence at intervals of n numbers for sorting in the reversal order, where n is a positive integer; or arbitrarily selecting bits in at least one subsequence for sorting in the reversal order.

An example in which a subsequence is selected at intervals of one subsequence is used. If numbers of the j subsequences are 1 to j, bits in some subsequences that are odd-numbered in the j subsequences are sorted in the reversal order, or bits in some subsequences that are even-numbered in the j subsequences are sorted in the reversal order, to obtain the second bit sequence.

It is assumed that a length of the first bit sequence is 16, and the first bit sequence is represented by {0, 1, 2, 3, 4, 5, 6, 7, 8, 9, 10, 11, 12, 13, 14, 15}. If the first bit sequence is equally divided into four segments, in other words, j=4, four subsequences are respectively {0, 1, 2, 3}, {4, 5, 6, 7}, {8, 9, 10, 11}, and {12, 13, 14, 15}. After bits in some subsequences that are odd-numbered are sorted in the reversal order, an obtained second bit sequence is {3, 2, 1, 0, 4, 5, 6, 7, 11, 10, 9, 8, 12, 13, 14, 15}; and after bits in some subsequences that are even-numbered are sorted in the reversal order, an obtained second bit sequence is {0, 1, 2, 3, 7, 6, 5, 4, 8, 9, 10, 11, 15, 14, 13, 12}.

After some subsequences are sorted in the reversal order, compared with the first bit sequence, the second bit sequence is interleaved. The M bits are selected from the second bit sequence by using an interleaver or a buffer, to achieve the rate matching.

If the interleaver is used, the second bit sequence is written into an interleaver of i rows and j columns, and the M bits are read from the interleaver, where bits in a column in the interleaver include one of the j subsequences; and each column has a same reading order.

Similarly, if a manner of the rate matching is puncturing, the M bits are sequentially read by starting from the last bit of a $j^{th}$ column of the interleaver; or P bit locations starting from the first bit of the first column of the interleaver are skipped, and the M bits are sequentially read by starting from a $(P+1)^{th}$ bit.

If a manner of the rate matching is shortening, the M bits are sequentially read by starting from the first bit of the first column of the interleaver; or P bit locations starting from the last bit of a $j^{th}$ column of the interleaver are skipped, and the M bits are sequentially read by starting from a $(P+1)^{th}$ bit.

If the buffer is used, the second bit sequence is input into the buffer bit by bit, and the M bits are read from the buffer.

If a manner of the rate matching is puncturing, the M bits are sequentially read by starting from the last bit in the buffer; or P bit locations starting from the first bit in the buffer are skipped, and the M bits are sequentially read by starting from a $(P+1)^{th}$ bit.

If a manner of the rate matching is shortening, the M bits are sequentially read by starting from the first bit in the buffer; or P bit locations starting from the last bit in the buffer are skipped, and the M bits are sequentially read by starting from a $(P+1)^{th}$ bit.

Figure 8:
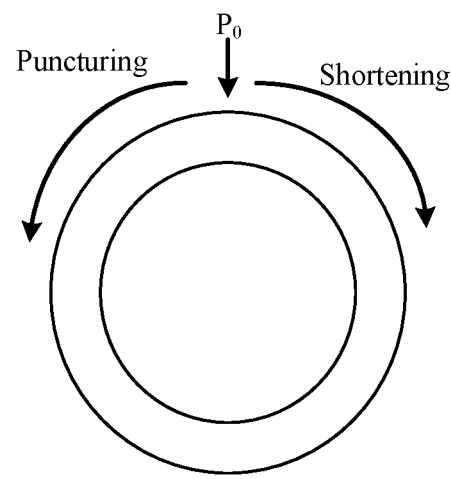
FIG. 8 is a schematic diagram of a buffer-based reading manner according to an embodiment of this application.

As shown in FIG. 8, the second bit sequence is written into a cyclic buffer by starting from $P_0$, $P_0$ is both a starting location and an ending location of the cyclic buffer. If the rate matching manner of puncturing is used, the M bits are read by starting from $P_0$ in a direction opposite to a writing direction and are used as bits obtained after the rate matching and the interleaving. If the rate matching manner of shortening is used, the M bits are read by starting from $P_0$ in a direction the same as a writing direction and are used as bits obtained after the rate matching and the interleaving.

It should be noted that in the interleaving method provided in this embodiment of this application, a writing and reading manner when the interleaver is used is writing by column and reading by column. In some embodiments, a reading manner of writing by row and reading by row may alternatively be used.

In a manner of writing into and reading from the interleaver, if a quantity of rows is fixed to i, a value of i may be a positive odd number or a positive prime number. For example, the quantity i of rows may be selected as 5, 7, 11, or the like.

The foregoing interleaving method is further described in detail below by using an example.

Figure 9:
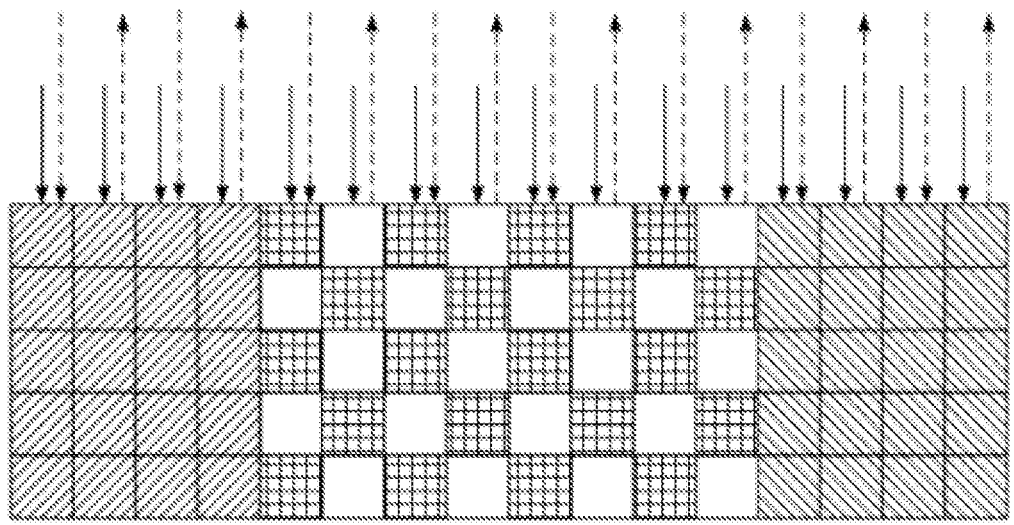
FIG. 9 is a schematic diagram 3 of an interleaving method according to an embodiment of this application.
Figure 9:
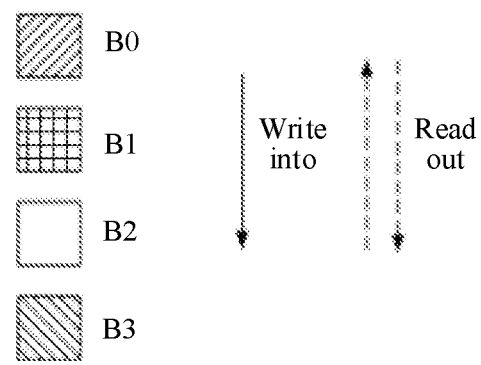

As shown in FIG. 9, assuming that a method for obtaining the first bit sequence is the foregoing sorting method 1, the encoded bits are divided into four segments: B0, B1, B2, and B3, and bits in the second segment B1 and bits in the third segment B2 are crossed bit by bit for interleaving. As shown in FIG. 9, assuming that a length of a first sorting sequence is 80, a length of each segment is 20. The first bit sequence obtained after the interleaving is written into the interleaver column by column in a direction of a solid-line arrow shown in FIG. 9, and the bits in B1 and the bits in B2 are placed in a crossed manner bit by bit. If the rate matching is performed through puncturing, the M bits are sequentially read from back to front by starting from the last bit. This is represented in FIG. 9 as: reading is performed from the last column of the interleaver column by column in a direction of a dashed-line arrow. An interleaved reading manner in FIG. 9 is a manner in which one column is read in a positive order and one column is read in a reversal order.

A decoding procedure at a decoding end in the various embodiments is approximately: performing de-interleaving and rate de-matching on a to-be-decoded sequence that is received, and performing polar code decoding on an obtained sequence. Similarly, the decoding end may obtain a de-interleaving mode based on an interleaving mode at an encoding end, and perform a de-interleaving operation based on the obtained de-interleaving mode. Repetitions are not described herein.

Figure 10:
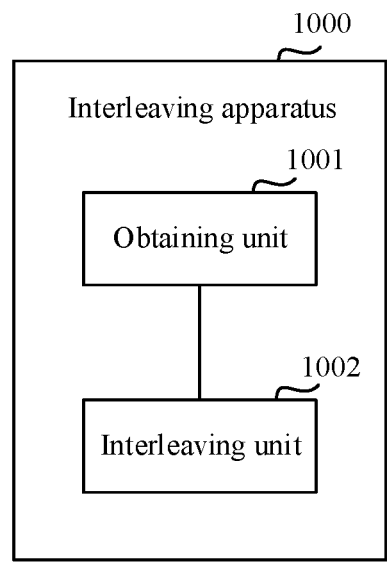
FIG. 10 is a schematic diagram 1 of an interleaving apparatus according to an embodiment of this application.

Based on the interleaving method shown in FIG. 6, as shown in FIG. 10, an embodiment further provides an interleaving apparatus 1000. The interleaving apparatus 1000 is configured to perform the method shown in FIG. 6. The interleaving apparatus 1000 includes:

an obtaining unit 1001, configured to obtain encoded bits after polar code encoding, and sort the encoded bits based on a priority order of performing a rate matching operation, to obtain a first bit sequence, where the first bit sequence includes j subsequences, and j is a positive integer; and an interleaving unit 1002, configured to write the first bit sequence into an interleaver of i rows and j columns, and read out bits from the interleaver column by column, until M bits are read, where bits in a column in the interleaver include one of the j subsequences, at least two adjacent columns have opposite readout directions, and M is a target code length of a polar code.

In some embodiments, if a manner of the rate matching is puncturing, the interleaving unit 1002 is configured to: read out the bits column by column by starting from the last bit of a $j^{th}$ column of the interleaver, until the M bits are read; or skip P bit locations starting from the first bit of the first column of the interleaver, and read out bits other than bits at the P bit locations column by column by starting from a $(P+1)^{th}$ bit, until the M bits are read.

In some embodiments, if a manner of the rate matching is shortening, the interleaving unit 1002 is configured to: read out the bits column by column by starting from the first bit of the first column of the interleaver, until the M bits are read; or skip P bit locations starting from the last bit of a $j^{th}$ column of the interleaver, and read out bits other than bits at the P bit locations column by column by starting from a $(P+)^{th}$ bit, until the M bits are read.

In some embodiments, the interleaving unit 1002 is configured to: read out the bits column by column in a reading manner of alternating a positive order and a reversal order, until the M bits are read.

The reading manner of alternating the positive order and the reversal order includes: a reading manner of the positive order first and then the reversal order, or a reading manner of the reversal order first and then the positive order.

Figure 11:
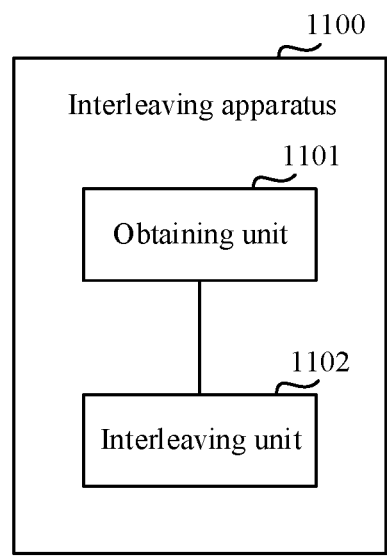
FIG. 11 is a schematic diagram 2 of an interleaving apparatus according to an embodiment of this application.

Based on the interleaving method shown in FIG. 7, as shown in FIG. 11, an embodiment of this application further provides an interleaving apparatus 1100. The interleaving apparatus 1100 is configured to perform the method shown in FIG. 7. The interleaving apparatus 1100 includes:

an obtaining unit 1101, configured to obtain encoded bits after polar code encoding, and sort the encoded bits based on a priority order of performing a rate matching operation, to obtain a first bit sequence, where the first bit sequence includes N bits, the first bit sequence includes j subsequences, and j is a positive integer; and an interleaving unit 1102, configured to: sort, in a reversal order, bits in some of the j subsequences obtained by the obtaining unit, to obtain a second bit sequence; and select M bits from the second bit sequence, and output the M bits, where M is a target code length of a polar code, and M is a positive integer.

In some embodiments, the interleaving unit 1102 is configured to:

if numbers of the j subsequences are 1 to j, perform, in the reversal order, an operation on bits in some subsequences that are odd-numbered in the j subsequences, or perform, in the reversal order, an operation on bits in some subsequences that are even-numbered in the j subsequences, to obtain the second bit sequence.

In some embodiments, the interleaving unit 1102 is configured to:

write the second bit sequence into an interleaver of i rows and j columns, where bits in a column in the interleaver includes one of the j subsequences; and read the M bits from the interleaver.

In some embodiments, if a manner of the rate matching is puncturing, the interleaving unit 1102 is configured to:

sequentially read the M bits by starting from the last bit of a $j^{th}$ column of the interleaver; or skip P bit locations starting from the first bit of the first column of the interleaver, and sequentially read the M bits by starting from a $P+1)^{th}$ bit.

In some embodiments, if a manner of the rate matching is shortening, the interleaving unit 1102 is configured to:

sequentially read the M bits by starting from the first bit of the first column of the interleaver; or skip P bit locations starting from the last bit of a $j^{th}$ column of the interleaver, and sequentially read the M bits by starting from a $(P+1)^{th}$ bit.

In some embodiments, the interleaving unit 1102 is configured to: write the second bit sequence into a buffer; and read the M bits from the buffer.

In some embodiments, if a manner of the rate matching is puncturing, the interleaving unit 1102 is configured to: sequentially read the M bits by starting from the last bit in the buffer; or skip P bit locations starting from the first bit in the buffer, and sequentially read the M bits by starting from a $(P+1)^{th}$ bit.

In some embodiments, if a manner of the rate matching is shortening, the interleaving unit 1102 is configured to: sequentially read the M bits by starting from the first bit in the buffer; or skip P bit locations starting from the last bit in the buffer, and sequentially read the M bits by starting from a $(P+1)^{th}$ bit.

Figure 12:
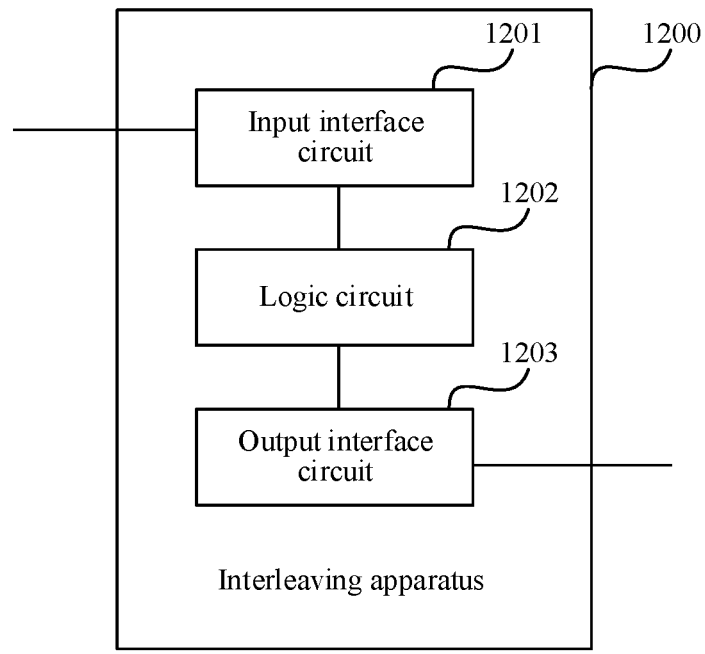
FIG. 12 is a schematic diagram 3 of an interleaving apparatus according to an embodiment of this application.

Based on the interleaving method shown in FIG. 6, as shown in FIG. 12, an embodiment further provides an interleaving apparatus 1200. The interleaving apparatus 1200 is configured to perform the interleaving method shown in FIG. 6. A part or all of the interleaving method shown in FIG. 6 may be implemented by hardware or may be implemented by software. When the part or all of the interleaving method is implemented by hardware, the interleaving apparatus 1200 includes: an input interface circuit 1201, configured to obtain encoded bits after polar code encoding; a logic circuit 1202, configured to perform a step other than steps of obtaining and outputting the bits in the method shown in FIG. 6, where for details, refer to the descriptions in the foregoing method embodiment, and details are not described herein again; and an output interface circuit 1203, configured to output M bits.

In some embodiments, the interleaving apparatus 1200 may be a chip or an integrated circuit in a specific implementation.

Figure 13:
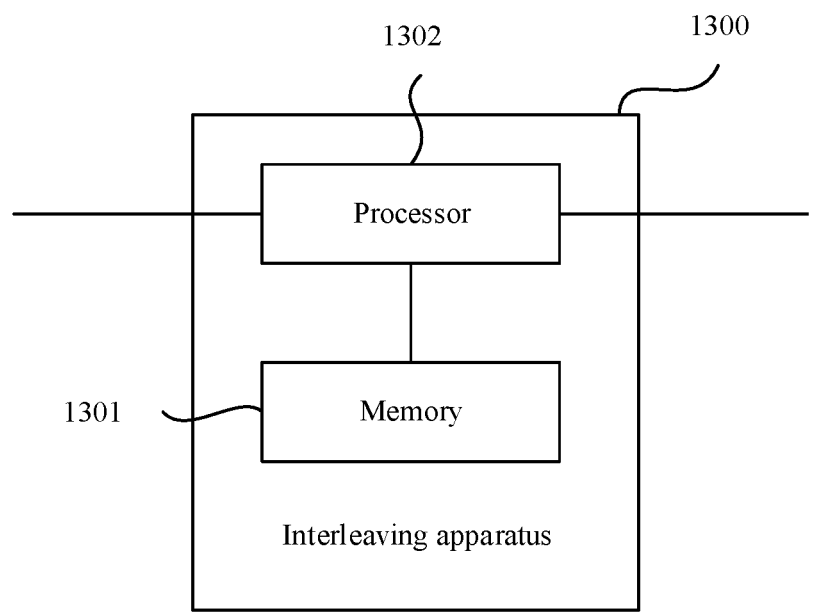
FIG. 13 is a schematic diagram 4 of an interleaving apparatus according to an embodiment of this application.

In some embodiments, when the part or all of the interleaving method in the foregoing embodiment is implemented by software, as shown in FIG. 13, an interleaving apparatus 1300 includes: a memory 1301, configured to store a program; and a processor 1302, configured to execute the program stored in the memory 1301. When the program is executed, the interleaving apparatus 1300 is enabled to implement the interleaving method provided in the embodiment in FIG. 6.

In some embodiments, the memory 1301 may be a physically independent unit, or may be integrated with the processor 1302.

In some embodiments, when the part or all of the interleaving method in the embodiment in FIG. 6 is implemented by software, the interleaving apparatus 1300 may alternatively include only a processor 1302. A memory 1301 configured to store a program is located outside the interleaving apparatus 1300. The processor 1302 is connected to the memory 1301 through a circuit/wire and is configured to read and execute the program stored in the memory 1301.

The processor 1302 may be a central processing unit (central processing unit, CPU), a network processor (network processor, NP), or a combination of a CPU and an NP.

The processor 1302 may further include a hardware chip. The hardware chip may be an application-specific integrated circuit (ASIC), a programmable logic device (PLD), or a combination thereof. The PLD may be a complex programmable logic device (CPLD), a field-programmable gate array (FPGA), a generic array logic (GAL), or any combination thereof.

The memory 1301 may include a volatile memory, for example, a random-access memory (RAM). Alternatively, the memory 1301 may include a non-volatile memory, for example, a flash memory, a hard disk drive (hard disk drive, HDD), or a solid-state drive (solid-state drive, SSD). Alternatively, the memory 1301 may include a combination of the foregoing types of memories.

Figure 14:
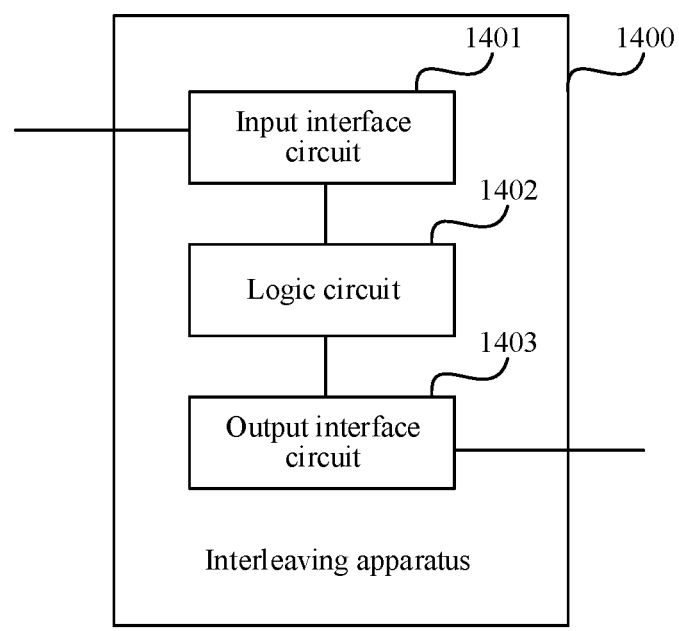
FIG. 14 is a schematic diagram 5 of an interleaving apparatus according to an embodiment of this application.

Based on the interleaving method shown in FIG. 7, as shown in FIG. 14, an embodiment of this application further provides an interleaving apparatus 1400. The interleaving apparatus 1400 is configured to perform the interleaving method shown in FIG. 7. A part or all of the interleaving method shown in FIG. 7 may be implemented by hardware or may be implemented by software. When the part or all of the interleaving method is implemented by hardware, the interleaving apparatus 1400 includes: an input interface circuit 1401, configured to obtain encoded bits after polar code encoding; a logic circuit 1402, configured to perform a step other than steps of obtaining and outputting the bits in the method shown in FIG. 7, where for details, refer to the descriptions in the foregoing method embodiment, and details are not described herein again; and an output interface circuit 1403, configured to output M bits.

In some embodiments, the interleaving apparatus 1400 may be a chip or an integrated circuit in a specific implementation.

Figure 15:
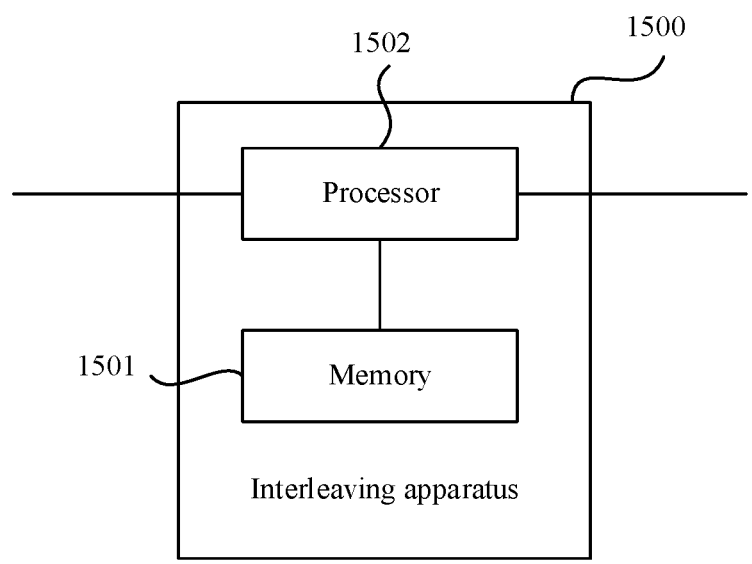
FIG. 15 is a schematic diagram 6 of an interleaving apparatus according to an embodiment of this application.

In some embodiments, when the part or all of the interleaving method in the foregoing embodiment is implemented by software, as shown in FIG. 15, an interleaving apparatus 1500 includes: a memory 1501, configured to store a program; and a processor 1502, configured to execute the program stored in the memory 1501. When the program is executed, the interleaving apparatus 1500 is enabled to implement the interleaving method provided in the embodiment in FIG. 7.

In some embodiments, the memory 1501 may be a physically independent unit, or may be integrated with the processor 1502.

In some embodiments, when the part or all of the interleaving method in the embodiment in FIG. 7 is implemented by software, the interleaving apparatus 1500 may alternatively include only a processor 1502. A memory 1501 configured to store a program is located outside the interleaving apparatus 1500. The processor 1502 is connected to the memory 1501 through a circuit/wire and is configured to read and execute the program stored in the memory 1501.

The processor 1502 may be a central processing unit (CPU), a network processor (NP), or a combination of a CPU and an NP.

The processor 1502 may further include a hardware chip. The hardware chip may be an application-specific integrated circuit (ASIC), a programmable logic device (PLD), or a combination thereof. The PLD may be a complex programmable logic device (CPLD), a field-programmable gate array (FPGA), a generic array logic (GAL), or any combination thereof.

The memory 1501 may include a volatile memory, for example, a random-access memory (RAM). Alternatively, the memory 1501 may include a non-volatile memory (non-volatile memory), for example, a flash memory, a hard disk drive (HDD), or a solid-state drive (SSD). Alternatively, the memory 1501 may include a combination of the foregoing types of memories.

An embodiment further provides a computer storage medium. The computer storage medium stores a computer program, and the computer program includes an instruction used to perform the interleaving method shown in FIG. 6 or FIG. 7.

An embodiment further provides a computer program product including an instruction. When the computer program product is run on a computer, the computer is enabled to perform the interleaving method shown in FIG. 6 or FIG. 7.

Persons skilled in the art should understand that the various embodiments may be provided as a method, a system, or a computer program product. Therefore, this application may use a form of hardware only embodiments, software only embodiments, or embodiments with a combination of software and hardware. Moreover, this application may use a form of a computer program product that is implemented on one or more computer-usable storage media (including but not limited to a disk memory, a CD-ROM, an optical memory, and the like) that include computer-usable program code.

This application is described with reference to the flowcharts and/or block diagrams of the method, the device (system), and the computer program product according to the various embodiments. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a special-purpose computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

Although some preferred various embodiments have been described, persons skilled in the art can make changes and modifications to these embodiments once they learn the basic inventive concept. Therefore, the following claims are intended to be construed as to cover the preferred embodiments and all changes and modifications falling within the scope of this application.

Apparently, persons skilled in the art can make various modifications and variations to the various embodiments without departing from the spirit and scope of the various embodiments. This application is intended to cover these modifications and variations provided that they fall within the scope of protection defined by the following claims and their equivalent technologies.

What is claimed is:

1. An interleaving method, comprising:
obtaining encoded bits after polar code encoding;
sorting the encoded bits based on a priority order of performing a rate matching operation, to obtain a first bit sequence, wherein the first bit sequence comprises N bits, the first bit sequence comprises j subsequences, and j is a positive integer;
writing the first bit sequence into an interleaver of i rows and j columns, wherein bits in a column in the interleaver comprise one of the j subsequences, and i is a positive integer; and
reading out bits from the interleaver column by column, until M bits are read, wherein at least two adjacent columns have opposite readout directions, and M is a target code length of a polar code.

2. The method according to claim 1, wherein when a manner of the rate matching is puncturing, reading out the bits from the interleaver column by column, until the M bits are read comprises:
reading out the bits column by column by starting from a last bit of $j^{th}$ column of the interleaver, until the M bits are read; or
skipping P bit locations starting from a first bit of a first column of the interleaver, and
reading out bits other than bits at the P bit locations column by column by starting from a $(P+1)^{th}$ bit, until the M bits are read.

3. The method according to claim 1, wherein when a manner of the rate matching is shortening, reading out the bits from the interleaver column by column, until the M bits are read comprises:
reading out the bits column by column by starting from a first bit of a first column of the interleaver, until the M bits are read; or
skipping P bit locations starting from a last bit of a $j^{th}$ column of the interleaver, and reading out bits other than bits at the P bit locations column by column by starting from a $(P+1)^{th}$ bit, until the M bits are read.

4. The method according to claim 1, wherein the reading out the bits column by column, until the M bits are read comprises:
reading out the bits column by column in a reading manner of alternating a positive order and a reversal order, until the M bits are read, wherein the reading manner of alternating the positive order and the reversal order comprises: a reading manner of the positive order first and then the reversal order, or a reading manner of the reversal order first and then the positive order.

5. An interleaving method, comprising:
obtaining encoded bits after polar code encoding;
sorting the encoded bits based on a priority order of performing a rate matching operation, to obtain a first bit sequence, wherein the first bit sequence comprises N bits, the first bit sequence comprises j subsequences, and j is a positive integer;
sorting bits in some of the j subsequences in a reversal order, to obtain a second bit sequence; and
reading out M bits from the second bit sequence, wherein M is a target code length of a polar code, and M is a positive integer.

6. The method according to claim 5, wherein sorting the bits in some of the j subsequences in a reversal order, to obtain a second bit sequence comprises:
sorting, in the reversal order, bits in some subsequences that are odd-numbered in the j subsequences, or sorting, in the reversal order, bits in some subsequences that are even-numbered in the j subsequences, to obtain the second bit sequence.

7. The method according to claim 5, wherein the reading out M bits from the second bit sequence comprises:
writing the second bit sequence into an interleaver of i rows and j columns, wherein bits in a column in the interleaver comprise one of the j subsequences; and reading the M bits from the interleaver.

8. The method according to claim 7, wherein when a manner of the rate matching is puncturing, the reading the M bits from the interleaver comprises:
sequentially reading the M bits by starting from a last bit of a $j^{th}$ column of the interleaver; or
skipping P bit locations starting from a first bit of a first column of the interleaver, and sequentially reading the M bits by starting from a $(P+1)_{th}$ bit.

9. The method according to claim 7, wherein when a manner of the rate matching is shortening, the reading the M bits from the interleaver comprises:
sequentially reading the M bits by starting from a first bit of a first column of the interleaver; or
skipping P bit locations starting from a last bit of a $j^{th}$ column of the interleaver, and sequentially reading the M bits by starting from a $(P+1)_{th}$ bit.

10. The method according to claim 5, wherein reading out the M bits from the second bit sequence based on a manner of the rate matching comprises:
writing the second bit sequence into a buffer; and reading the M bits from the buffer.

11. The method according to claim 10, wherein when the manner of the rate matching is puncturing, reading the M bits from the buffer comprises:
sequentially reading the M bits by starting from a last bit in the buffer; or
skipping P bit locations starting from a first bit in the buffer, and sequentially reading the M bits by starting from a $(P+1)^{th}$ bit.

12. The method according to claim 10, wherein when the manner of the rate matching is shortening, the reading the M bits from the buffer comprises:
sequentially reading the M bits by starting from a first bit in the buffer; or
skipping P bit locations starting from a last bit in the buffer, and sequentially reading the M bits by starting from a $(P+1)^{th}$ bit.

13. An interleaving apparatus, comprising:
an obtaining unit, configured to obtain encoded bits after polar code encoding, and sort the encoded bits based on a priority order of performing a rate matching operation, to obtain a first bit sequence, wherein the first bit sequence comprises N bits, the first bit sequence comprises j subsequences, and j is a positive integer; and
an interleaving unit, configured to: sort, in a reversal order, bits in some of the j subsequences obtained by the obtaining unit, to obtain a second bit sequence; and read out M bits from the second bit sequence, and output the M bits, wherein M is a target code length of a polar code, and M is a positive integer.

14. The apparatus according to claim 13, wherein the interleaving unit is configured to:
if numbers of the j subsequences are 1 to j, sort, in the reversal order, bits in some subsequences that are odd-numbered in the j subsequences, or sort, in the reversal order, bits in some subsequences that are even-numbered in the j subsequences, to obtain the second bit sequence.

15. The apparatus according to claim 13, wherein the interleaving unit is configured to:
write the second bit sequence into an interleaver of i rows and j columns, wherein bits in a column in the interleaver comprise one of the j subsequences; and read the M bits from the interleaver.

16. The apparatus according to claim 15, wherein if a manner of the rate matching operation is puncturing, the interleaving unit is configured to:
sequentially read the M bits by starting from a last bit of a $j^{th}$ column of the interleaver; or
skip P bit locations starting from a first bit of a first column of the interleaver, and sequentially read the M bits by starting from a $(P+1)^{th}$ bit.

17. The apparatus according to claim 15, wherein if a manner of the rate matching operation is shortening, the interleaving unit is configured to:
sequentially read the M bits by starting from a first bit of a first column of the interleaver; or
skip P bit locations starting from a last bit of a $j^{th}$ column of the interleaver, and sequentially read the M bits by starting from a $(P+1)^{th}$ bit.

18. The apparatus according to claim 13, wherein the interleaving unit is configured to:
write the second bit sequence into a buffer; and read the M bits from the buffer.

19. The apparatus according to claim 18, wherein if a manner of the rate matching operation is puncturing, the interleaving unit is configured to:
sequentially read the M bits by starting from a last bit in the buffer; or
skip P bit locations starting from a first bit in the buffer, and sequentially read the M bits by starting from a $(P+1)^{th}$ bit.

20. The apparatus according to claim 18, wherein if a manner of the rate matching operation is shortening, the interleaving unit is configured to:
sequentially read the M bits by starting from a first bit in the buffer; or
skip P bit locations starting from a last bit in the buffer, and sequentially read the M bits by starting from a $(P+1)^{th}$ bit.

* * * * *